United States Patent [19]
Alfke et al.

[11] 4,023,116
[45] May 10, 1977

[54] PHASE-LOCKED LOOP FREQUENCY SYNTHESIZER

[75] Inventors: Peter H. Alfke, Los Altos Hills; Charles H. Alford, Santa Clara; Eric G. Breeze, Los Altos, all of Calif.

[73] Assignee: Fairchild Camera and Instrument Corporation, Mountain View, Calif.

[22] Filed: July 8, 1976

[21] Appl. No.: 703,394

[52] U.S. Cl. .................................. 331/17; 325/421; 328/155; 331/11
[51] Int. Cl.² ........................................... H03B 3/04
[58] Field of Search .............. 331/1, 10, 11, 16, 17; 325/418, 419, 420, 421; 328/155

[56] References Cited
UNITED STATES PATENTS

| | | | |
|---|---|---|---|
| 2,962,666 | 11/1960 | Pollak | 331/17 |
| 3,805,182 | 4/1974 | Melcher | 331/16 |
| 3,805,192 | 4/1974 | Ocnaschek et al. | 325/419 |

Primary Examiner—John Kominski
Attorney, Agent, or Firm—Alan H. MacPherson; Henry K. Woodward; Norman E. Reitz

[57] ABSTRACT

A phase-locked loop frequency synthesizer is described not having the uncontrolled modulation of its output normally associated with such a synthesizer due to a detection dead band inherent in the phase/frequency comparator which is a principal part thereof. The frequency synthesizer includes, as is conventional, a reference oscillator and an oscillator for generating the synthesizer output. The comparator is also included as is conventional to detect unwanted deviations of the phase and frequency of the synthesizer output so they can be corrected. In order to compensate for the inability of the comparator to detect small unwanted deviations, a pulse generator is added to the synthesizer to apply what is, in effect, an intentional periodic phase error signal greater than the dead band difference. This causes the phase of the desired output to be corrected in a controlled manner which will prevent undesired frequency modulation of its output.

11 Claims, 3 Drawing Figures

PHASE-LOCKED LOOP FREQUENCY SYNTHESIZER

BACKGROUND OF THE INVENTION

The present invention relates to phase-locked loop frequency synthesizers and, more particularly, to such a frequency synthesizer not having the uncontrolled small frequency modulation of its output typical of the prior art.

The makers of electronic equipment are finding phase-locked loop frequency synthesizers to be important components of many items. For example, synthesizers of this type having voltage controlled oscillators are now becoming widely used as digital tuners for communication transmitters and receivers. They are also now commonly used in controllers for variable speed motors.

Generally, a phase-locked loop frequency synthesizer relies for control of the frequency of its output signal on a comparison of the frequency of an oscillatory signal derived from such output with the frequency of an oscillation generated by a reference oscillator. The comparisons are typically made by phase/frequency detectors, such as of the type included in the integrated circuit chip sold by the Fairchild Semiconductor Components Group of Fairchild Camera and Instrument Corporation with the component designation 11C44. The technology of phase/frequency detectors, however, leaves much to be desired. Because of internal timing delays, such detectors are incapable of detecting small differences in the phase between the reference oscillator signal and the derived comparison signal. The result is that the phase of the synthesizer output can drift to some degree without being corrected. When the degree of drift becomes sufficiently large to enable detection by the phase/frequency detector, the detector will react by generating a phase correction signal for application to the synthesizer output. Thus, because of this "dead band" in phase difference which cannot be detected by the phase/frequency detector, the frequency of the synthesizer output will oscillate about or, in other words, "hunt" around, the desired frequency. This spurious modulation of the frequency is especially undesirable in communications applications in which the output of the synthesizer is deliberately modulated with a communication information signal. Such spurious modulations appear as increased noise and distortion. Also, in controllers for variable speed motors, the spurious modulations cause speed control variations which consequently reduce the preciseness of the controller and limits the uses for which variable speed motors are appropriate.

SUMMARY OF THE INVENTION

The present invention is an improved phase-locked loop frequency synthesizer which essentially eliminates the likelihood that phase drift in the oscillatory output of the synthesizer will cause spurious modulations of such output. In its basic aspects, the frequency synthesizer of the invention includes, as is usual, means, such as a voltage controlled oscillator, for producing an output of a desired frequency, a reference electrical oscillator, and phase correction means for detecting any difference in phase between the output of the reference oscillator and a comparison oscillation derived from the desired output which is greater than the dead band. The phase correction means responds to such a greater difference by issuing a phase correction signal to the means for producing the desired output, designed to change the phase of the desired output to be essentially consonant with the phase of the reference oscillator output.

The frequency synthesizer of the invention also includes, as part of the combination, an electrical signal generator which directs an intentional phase change signal to the phase correction means representative of a difference in phase between the reference and comparison oscillations which is greater than the dead band. The result is that the phase correction means issues a phase change signal which causes the dead band of the phase correction means to be avoided.

Most desirably, the phase change signal is a periodic signal which is applied to the output oscillator at a frequency correlated with the frequency of such output. Such a periodic signal will not cause the unwanted reaction in the specific circuitry often attendant to the application of a constant bias. In spite of the fact that the intentional phase signal is periodic, the result of it will be a constant, unvarying phase difference between the frequency of the comparison signal and the frequency of the reference signal.

The invention includes other features and advantages which will either be described or become apparent from the following more detailed description of a preferred enbodiment.

DETAILED DESCRIPTION OF THE DRAWING

With reference to the accompanying two sheets of drawing.

DETAILED DESCRIPTION OF THE PREFERRED EMBODIMENT

Figure 1:
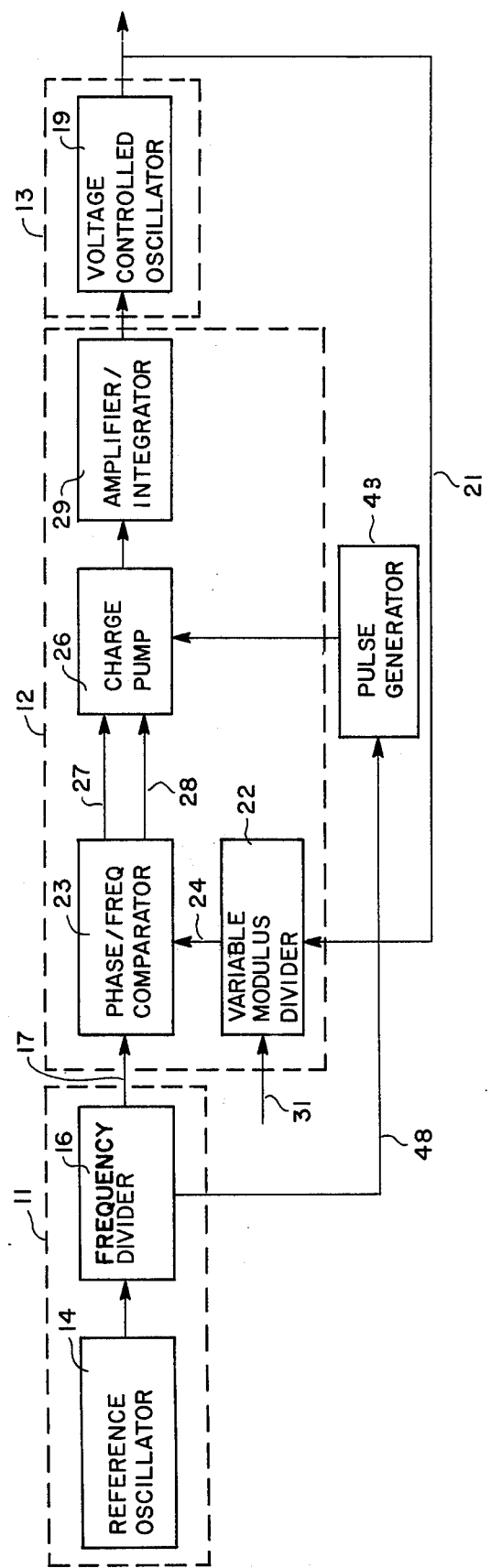
FIG. 1 is an electrical logic diagram of a preferred phase-locked loop frequency synthesizer of the invention.

The phase-locked loop frequency synthesizer of the invention includes the three basic functional parts typical of conventional synthesizers. These parts are set apart in FIG. 1 respectively by dotted line enclosures 11, 12 and 13. Enclosure 11 includes means for producing a reference electrical oscillation. That is, it includes a reference oscillator 14, such as a crystal oscillator, and a reference modulus divider 16. As indicated, the output of the reference oscillator is fed to the divider which appropriately reduces its frequency to one easily measured. For example, if reference oscillator produces oscillations having a constant frequency of 10 megahertz, divider 16 can reduce such frequency to around 5 kilohertz. The output of divider 16, as represented in FIG. 1 by flow line 17 will be a digital signal of a predetermined frequency, which signal is represented in graphical fornm at 18 in both FIGS. 2 and 3.

Enclosure 13 represents means for producing an oscillatory output in the range of a desired frequency, and enclosure 12 represents phase and frequency correction means for conforming the phase and frequency of the oscillatory output to that of the output of the reference oscillator. In this preferred embodiment, the means for producing an electrical oscillation output in the range of a desired frequency is a voltage controlled oscillator 19. As illustrated, its output is connected via feedback loop 21 through a variable modulus divider 22 to a phase/frequency detector or comparator 23. The phase/frequency comparator 23 is the main component of the phase correction means 12, and divider 22 is responsive to the frequency emanating at the output of the voltage controlled oscillator 19 by generating corresponding digital signals and applying the same via its output 24 to such comparator.

Comparator 23 compares the reference signal 18 issuing from the divider 16 with the comparison signal emanating from the modulus divider 22 and responds to any significant difference therebetween by issuing an error signal to a charge pump 26. It accomplishes the comparison by detecting any time difference between the falling edges of the respective digital signals.

The operational connection between the comparator 23 and the charge pump 26 is represented by two flow lines 27 and 28. One of such flow lines, such as flow line 27, represents the application to the charge pump of an error signal from the comparator 23 indicative of the phase of the output of the divider 22 leading the phase of the output of the reference divider 16, and the other flow line, flow lind 28, represents flow of an error signal from the phase/frequency comparator indicating that the phase of the output of the variable divider 22 lags the phase of the output of the reference divider 16. Charge pump 26 responds to receipt of an error signal on either line 27 or 28 by applying a phase correction signal through an amplifier/integrater 29 to the voltage controlled oscillator 19 to correct the phase of its output relative to the phase of the reference oscillator output.

Most desirably, the variable modulus divider 22 is one, such as the one sold by the Fairchild Semiconductor Components Group of Fairchild Camera and Instrument Corporation with the model designation 9310 whose divisor is selectively variable incrementally as represented by the flow line 31, by an external controller, such as a digital thumb wheel switch. The output frequency of the variable divider thus will be incrementally variable to change the frequency of the digital signal issuing therefrom which is compared with the digital signal issuing from reference divider 16. The result is that the comparator 23 can be made to issue an error signal to the charge pump 26 which will cause the same to direct a correction signal to the voltage control oscillator 19 which will, in turn, cause a corresponding change in the frequency of its output.

As mentioned previously, conventional phase-locked loop frequency synthesizers are not ideal. The difficulty arises because the phase/frequency comparators presently available are incapable of detecting small differences in phase between the two digital signals which are compared. Since a small error in the phase of the comparison signal issuing from the divider 22 represents a more significant variation at the output of the synthesizer, this "dead band" existence is a relatively major detriment of present synthesizers.

Figure 2:
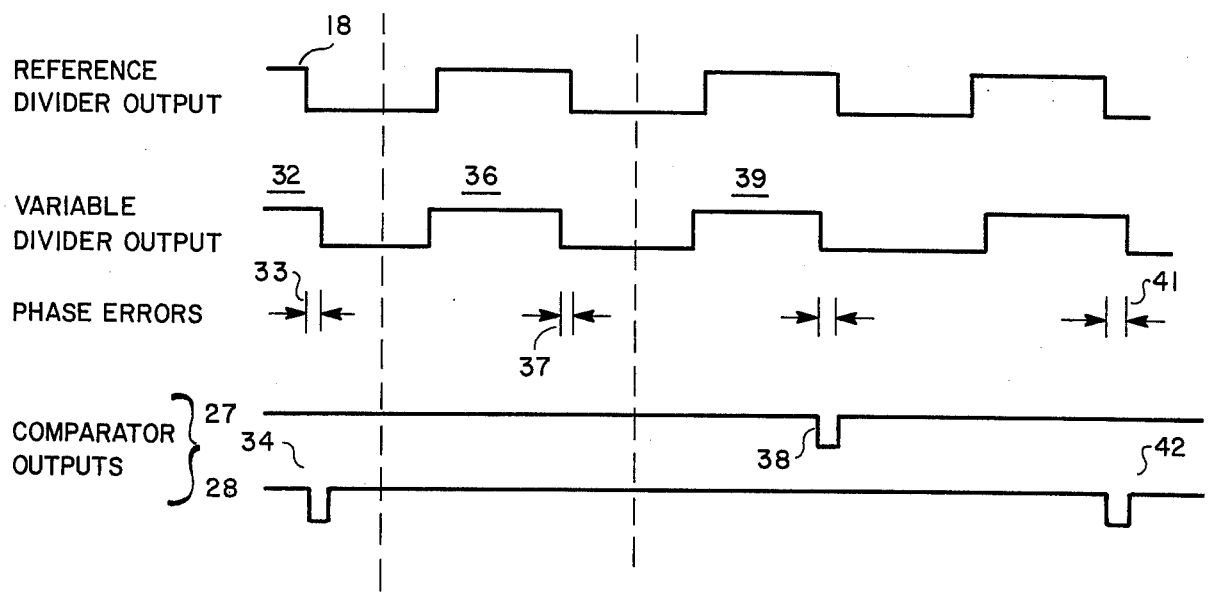
FIG. 2 illustrates in graphical form the relative timing sequence of signals normally generated by a frequency synthesizer.

FIG. 2 schematically illustrates this error phenomenon and its effect. With reference first to the left hand section of FIG. 2, section 32, the phase of the output of the variable divider is shown lagging the phase of the output of the reference divider by a phase angle greater than the dead band difference. This lag is schematically represented by the gap 33. since this phase error is greater than the dead band, an error signal as representd at 34 appears on the output 28 of the comparator 23. Not only does the appearance of the error signal on output 28 indicate that the variable divider output is lagging the reference divider, its duration indicates the degree of such lag. As illustrated, error pulse 34 is a positive going pulse which causes charge pump 26 to have sufficient charge added to the voltage controlled oscillator to cause the phase angle of such oscillator to be increased to correspond the phase angles of the comparison and reference digital signals. As a practical matter, the phase angle of the output oscillation will tend to continue to change in the increasing direction relative to the phase of the reference oscillation, with the result that the phase of the comparison divider output will begin leading the phase of the reference divider output. Such phase angle lead, however, may be in the dead band zone of the comparator, and section 36 of FIG. 2 illustrates the resulting signal state. When the phase error is less than the dead band difference of the comparator 23, as represented by the gap 37, the comparator will not generate an error signal on either of its outputs. This condition of the comparator outputs is also shown in section 36.

When the frequency drift of the output oscillation and, hence, the frequency drift of the variable divider output, is of sufficient magnitude that the comparator can again detect the difference between the variable divider output frequency and the reference divider output, the comparator will issue an error signal on line 27 of the charge pump 26. This error signal will be negative going as represented at 38 in section 39 of FIG. 2, and will cause the charge pump to have sufficient charge removed from the voltage controlled oscillator output to again correspond the phase of the comparison divider output with the phase of the reference divider output. The phase of the voltage controlled oscillator will now drift in the other direction to the point the phase of the comparison divider output will again lag the phase of the reference divider output by a sufficient amount as represented at 41 to cause another error pulse 42 to be generated on comparator output line 28.

The above sequence will continue, with the result that the phase of the output of the voltage controlled oscillator will continually hunt or, in other words, be modulated uncontrollably. As mentioned earlier, this spurious modulation detrimentally affects various uses to which a synthesizer output is often put.

The phase-locked loop frequency synthesizer of the invention eliminates the above uncontrolled modulation of the output frequency. Moreover, it relaxes the stringent performance requirements which have been applied to frequency/phase detectors in an effort to reduce the deleterious effects of the dead band. To this end, the frequency synthesizer of the invention further includes an electrical signal generator 43 (FIG. 1) adapted to direct an intentional phase change signal to the phase correction means representative of a difference in phase between the output oscillation of the two dividers which is greater than the dead band difference. This will cause the phase correction means to issue a corresponding phase correction signal to the oscillator which will cause the phase comparator to operate outside the dead band.

In more detail, generator 43 is a pulse generator which directs a phase change pulse to the charge pump 26 at a frequency correlated with the frequency at which the phase comparison is made. This pulse is applied through the integrater 29 to the voltage controlled oscillator 19 to cause a phase shift at the output of such oscillator consonant with the amount of charge represented thereby. This phase shift will be conditioned by comparison divider 22 to be compared with the output of the reference divider 16 by the phase comparator 23. Since this pulse is selected to cause a phase shift greater than the dead band difference, the comparator 23 will detect the same and direct the charge pump 26 to issue a periodic phase correction signal to the voltage controlled oscillator, which phase correction signal will cause the phase of the oscillator to be corrected relative to the phase of the reference oscillator. Most importantly, such periodic phase change signal will cause the comparator to operate outside its dead band.

It will be recognized from the above that the pulse generator 43 acts, in effect, as means which introduces an intentional error in the phase of the voltage controlled oscillator output, which intentional error is of a sufficient magnitude that it can be detected by the comparator which will then attempt to correct it. While the intentional error which is introduced could in theory be a constant error, such as one due to a constant DC bias, it is preferred that the error signal be a periodic pulse signal to avoid the deleterious effects a continuous bias may have on the circuitry.

Generator 43 is most simply controlled by reference divider 16 to cause charge pump 26 to apply a phase correction signal to th oscillator 19 once during each frequency cycle of the divider output. Most desirably, the pulse from the pulse generator is applied to the charge pump 26 contemporaneously with the application by the comparator of the error signal to such charge pump. In the context of this description and the appended claims, any timing sequence in which the pulse from the pulse generator overlaps or is immediately adjacent in time to the pulse from the charge pump is meant to be construed to be a "contemporaneous" application of the pulse from the pulse generator. Such contemporaneous application of the pulse will assure that, apart from a constant phase shift, the output frequency of the synthesizer will not be distorted by the introduced error.

Figure 3:
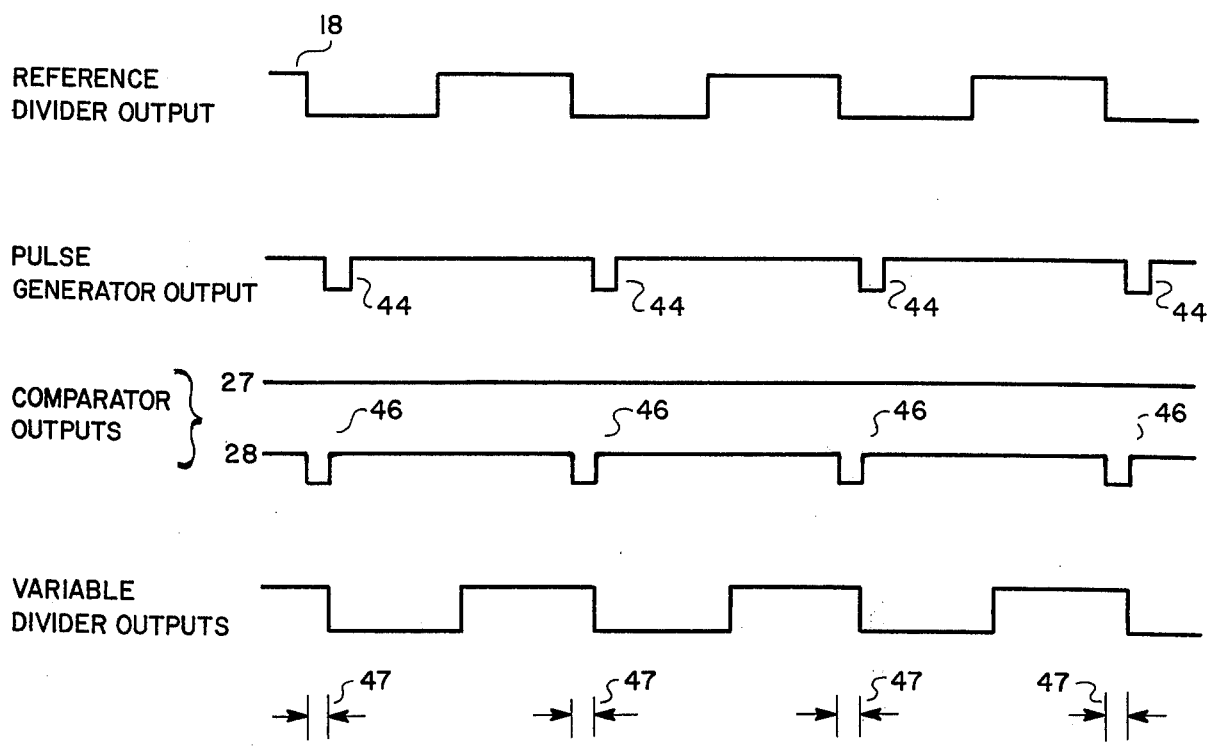
FIG. 3 illustrates the relative timing sequence of various signals generated within the preferred embodiment of the phase-locked loop frequency synthesizer of the invention depicted in FIG. 1.

For a better understanding of the above, reference is made to FIG. 3 which illustrates the timing sequence of the pulses produced by the generator 43 relative to other signals generated by the synthesizer. As shown therein, during each cycle of the reference divider output 18, a negative going pulse 44 is applied by the pulse generator 43 to the charge pump 26. This will cause the phase of the output from the voltage controlled oscillator 19 to lag behind by a constant phase angle the phase it would have had if the intentional error signal had not been introduced. That is, as mentioned previously, each of the pulses 44 is representative of a greater phase difference than the dead band. The result is that when the comparator compares the phase of the output of the variable divider 22 with the phase of the output of the divider 16, the comparator will generate a positive going error pulse 46 on the output 28 of the comparator, which pulse will cause the charge pump 26 to direct application of the requisite amount of charge to the voltage controlled oscillator to change its phase in an effort to conform the phases of the two digital signals which are compared. However, the phases of such digital signals are not actually allowed to conform. On the next comparison cycle, pulse generator 43 applies another negative going phase change pulse 44 to the charge pump which reacts thereby assuring that the change in the phase of the voltage controlled oscillator to output continues. This timing relationship of the pulses is simply controlled by the reference divider 16 providing appropriately timed control signals to the pulse generator 43 as is represented by the flow line 48.

The result of the above is that the output of the voltage controlled oscillator and, hence, the output of the comparison divider, will always lag the reference output by a constant phase difference as represented in FIG. 3 at 47. Such constant phase difference will not interfere with appropriate use of the output of the voltage controlled oscillator. However, because of operation of the comparator outside its dead band, drift of the phase of the voltage controlled oscillator 19 essentially will be prevented. Moreover, since the dead band can be avoided irrespective of its size (within reason) by adjusting the size of the phase change signal applied by the generator to the charge pump, the design requirements on presently existing comparators can be relaxed without causing a corresponding relaxation in the performance of frequency synthesizers.

Although a preferred embodiment of the invention has been described in detail, it will be recognized by those skilled in the art that many changes can be made without departing from the principles of the invention. It is, therefore, intended that the coverage afforded applicants be limited only by the spirit of the invention as set forth in the claim language and its equivalent.

We claim:

1. A phase-locked frequency synthesizer comprising the combination of:

means for producing an electrical oscillation output in the range of a desired frequency;

means for producing a reference electrical oscillation;

phase correction means for detecting any difference in phase between said reference electrical oscillation and a comparison oscillation derived from said electrical oscillation output which is greater than a difference in a dead band of said phase correction means and responding to such a greater difference by issuing a phase correction signal to said means for producing an electrical oscillation output selected to change the phase thereof to be essentially consonant with the phase of said reference electrical oscillation; and an electrical signal generator adapted to direct an intentional phase change signal to said phase correction means representative of a difference in phase between said reference and comparison oscillations greater than said dead band difference to cause said phase correction means to issue a phase correction signal to said means for producing an electrical oscillation output whereby said dead band of said phase correction means is avoided.

2. The phase-locked frequency synthesizer of claim 1 wherein said phase correction means includes a comparator which compares the phase of said comparison oscillation with said reference electrical oscillation and generates an error signal indicative of any difference between said phases whenever such a difference is greater than said dead band difference, and a charge pump responsive to receipt of an error signal from said comparator by generating said phase correction signal.

3. The phase-locked frequency synthesizer of claim 2 wherein said means for producing a reference electrical oscillation output includes a reference oscillator and a modulus divider responsive to the output of said reference oscillator by generating a reference digital signal of a predetermined frequency, and said phase correction means further includes a second modulus divider in a feedback loop to said comparator from the output of said means for producing an electrical oscillation output, which divider is responsive to said electrical oscillation output by generating said comparison oscillation as a digital signal corresponding to said electrical oscillation output for comparison by said comparator with said reference digital signal.

4. The phase-locked frequency synthesizer of claim 2 wherein said electrical signal generator is adapted to direct said intentional phase signal periodically to said phase correction means to cause said phase correction means to issue said phase correction signal periodically.

5. The phase-locked frequency synthesizer of claim 4 wherein said generator is adapted to cause applicaiton of said phase correction signal to said means for producing an electrical oscillation output periodically at a frequency correlated with the frequency at which said comparator compares the phase of said comparison oscillation with said reference oscillation.

6. The phase-locked frequency synthesizer of claim 5 wherein said generator directs said phase correction means to apply said phase correction signal to said means for producing an electrical oscillation output once during each frequency cycle of said comparison oscillation.

7. The phase-locked frequency synthesizer of claim 5 wherein said generator is connected with said phase correction means to apply said periodic phase change signal to said charge pump essentially contemporaneously with the application by said comparator of said error signal to said charge pump, whereby distortion by said phase change signal of the frequency of the output of said means for producing an electrical oscillation output is minimized.

8. The phase-locked frequency synthesizer of claim 7 wherein said generator is connected with said phase correction means to apply said periodic phase change signal to said charge pump immediately adjacent in time to the application by said comparator of said error signal to said charge pump.

9. The phase-locked frequency synthesizer of claim 5 wherein said means for producing a reference electrical oscillation output includes a reference oscillator and a modulus divider responsive to the output of said reference oscillator by generating a reference digital signal of a predetermined frequency, and said phase correction means further includes a second modulus divider in a feedback loop to said comparator from the output of said means for producing an electrical oscillation output which divider is responsive to said electrical oscillation output by generating said comparison oscillation as a digital signal corresponding to said electrical oscillation output for comparison by said comparator with said reference digital signal.

10. The phase-locked frequency synthesizer of claim 8 wherein said means for producing an electrical oscillation output in the range of a desired frequency is a voltage controlled oscillator, said comparator of said phase correction means compares both the phase and frequency of the reference digital signal with the phase and frequency of the comparison digital signal, and the frequency of the output of said second divider is selectively variable incrementally prior to its application to said comparator for causing said comparator to generate an error signal for application to said charge pump indicative of any frequency difference between said reference digital signal and said comparison digital signal, whereby the frequency of the output of said voltage controlled oscillator is selectively variable by changing the frequency of the output of said second divider.

11. The phase-locked frequency synthesizer of claim 10 wherein said generator is connected with said phase correction means to apply said periodic phase change signal to said charge pump essentially contemporaneously with the application by said comparator of said error signal to said charge pump, whereby distortion by said phase change signal of the frequency of the output of said means for producing an electrical oscillation output is minimized.

* * * * *